United States Patent
Jeong et al.

(10) Patent No.: US 9,700,917 B2
(45) Date of Patent: Jul. 11, 2017

(54) VIBRATING GENERATING DEVICE

(71) Applicant: Samsung Electro-Mechanics Co., Ltd., Suwon-si (KR)

(72) Inventors: Seung Hyeon Jeong, Suwon-si (KR); Hwa Young Oh, Suwon-si (KR)

(73) Assignee: MPLUS CO., LTD., Suwon-si, Gyeonggi-Do (KR)

( * ) Notice: Subject to any disclaimer, the term of this patent is extended or adjusted under 35 U.S.C. 154(b) by 394 days.

(21) Appl. No.: 14/638,326

(22) Filed: Mar. 4, 2015

(65) Prior Publication Data

US 2016/0074907 A1  Mar. 17, 2016

(30) Foreign Application Priority Data

Sep. 15, 2014  (KR) .................. 10-2014-0121720

(51) Int. Cl.
*H01L 41/053* (2006.01)
*B06B 1/06* (2006.01)
(Continued)

(52) U.S. Cl.
CPC .............. *B06B 1/0644* (2013.01); *B06B 3/00* (2013.01); *H01L 41/053* (2013.01); *H01L 41/098* (2013.01)

(58) Field of Classification Search
CPC ....... B06B 1/0644; B06B 3/00; B06B 1/0603; H01L 41/053; H01L 41/0926
(Continued)

(56) References Cited

U.S. PATENT DOCUMENTS

2010/0060107 A1* 3/2010 Seki .................. H02N 2/004
                                                      310/323.16
2012/0212100 A1* 8/2012 Lee .................. H01L 41/053
                                                      310/317
(Continued)

FOREIGN PATENT DOCUMENTS

JP        01-248974 A    10/1989
KR  10-2006-0000894 A    1/2006
(Continued)

OTHER PUBLICATIONS

Search in IP regarding term "Piezoelectric vibration with weight below piezoelectric".*
(Continued)

*Primary Examiner* — Bryan Gordon
(74) *Attorney, Agent, or Firm* — LRK Patent Law Firm

(57) ABSTRACT

There is provided a vibration generating device including: a piezoelectric element which is deformed when power is applied thereto; an installation member below which the piezoelectric element is installed; a weight fixedly installed below the installation member to be disposed below the piezoelectric element; a plurality of elastic members connected to the installation member to change a displacement direction by deformation of the installation member and disposed to face each other; and a damper member fixedly installed on a lower surface of the weight, wherein a thickness of the damper member is determined to allow the damper member to be disposed in a space formed by the plurality of elastic members when the elastic members are driven normally.

12 Claims, 7 Drawing Sheets

(51) Int. Cl.
*H01L 41/09* (2006.01)
*B06B 3/00* (2006.01)

(58) Field of Classification Search
USPC .................................... 310/317, 323.16, 326
See application file for complete search history.

(56) References Cited

U.S. PATENT DOCUMENTS

| | | | |
|---|---|---|---|
| 2014/0077661 A1* | 3/2014 | Smirnov | B06B 1/0651 |
| | | | 310/329 |
| 2014/0333179 A1* | 11/2014 | Oh | B06B 1/0633 |
| | | | 310/323.01 |
| 2014/0339958 A1* | 11/2014 | Park | H01L 41/0933 |
| | | | 310/326 |
| 2014/0346928 A1* | 11/2014 | Jun | H02N 2/006 |
| | | | 310/329 |
| 2015/0364668 A1* | 12/2015 | Jung | H01L 41/0933 |
| | | | 310/317 |

FOREIGN PATENT DOCUMENTS

| | | |
|---|---|---|
| KR | 10-1241030 B1 | 3/2013 |
| KR | 10-1320185 B1 | 10/2013 |
| KR | 2014-0071722 A | 6/2014 |

OTHER PUBLICATIONS

Search in IP regarding term "Vibration generating with damper and piezoelectric".*
KIPO Office Action for Korean Application No. 10-2014-0121720 which corresponds to the above-referenced U.S. application.

* cited by examiner

VIBRATING GENERATING DEVICE

CROSS-REFERENCE TO RELATED APPLICATION

This application claims the priority and benefit of Korean Patent Application No. 10-2014-0121720 filed on Sep. 15, 2014, with the Korean Intellectual Property Office, the disclosure of which is incorporated herein by reference.

BACKGROUND

The present disclosure relates to a vibration generating device.

Vibration generating devices, which convert electrical energy into mechanical vibrations through the generation of electromagnetic force, are commonly mounted in mobile phones, and the like, to thereby be used to silently notify users of call reception by transferring vibrations thereto.

Recently, a vibration generating device containing a piezoelectric element has been released onto the market. Such a vibration generating device including a piezoelectric element uses the principle of an inverse piezoelectric effect in which displacement is generated when voltage is applied to the piezoelectric element, which uses a principle of allowing a weight of a vibrator to be moved by the generated displacement to generate vibration force.

Meanwhile, in a case in which the weight of the vibrator vibrates abnormally due to external impacts, noise and damage to components may be generated due to a contact between the weight and other components.

In order to prevent the noise and the damage to the components due to inadvertent contact between the weight and the other components, a damper member may be provided. However, such a damper member may limit displacement of the vibrator during normal vibration operations of the vibrator to decrease a vibration amount.

RELATED ART DOCUMENT (Patent Document 1) Korean Patent Laid-Open Publication No. 2006-0000894

SUMMARY

An aspect of the present disclosure may provide a vibration generating device capable of alleviating external impacts and suppressing decreases in a vibration amount.

According to an aspect of the present disclosure, a vibration generating device may include: a piezoelectric element which is deformed when power is applied thereto; an installation member below which the piezoelectric element is installed; a weight fixedly installed below the installation member to be disposed below the piezoelectric element; a plurality of elastic members connected to the installation member to change a displacement direction by deformation of the installation member and disposed to face each other; and a damper member fixedly installed on a lower surface of the weight, wherein a thickness of the damper member is determined to allow the damper member to be disposed in a space formed by the plurality of elastic members when the elastic members are driven normally.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
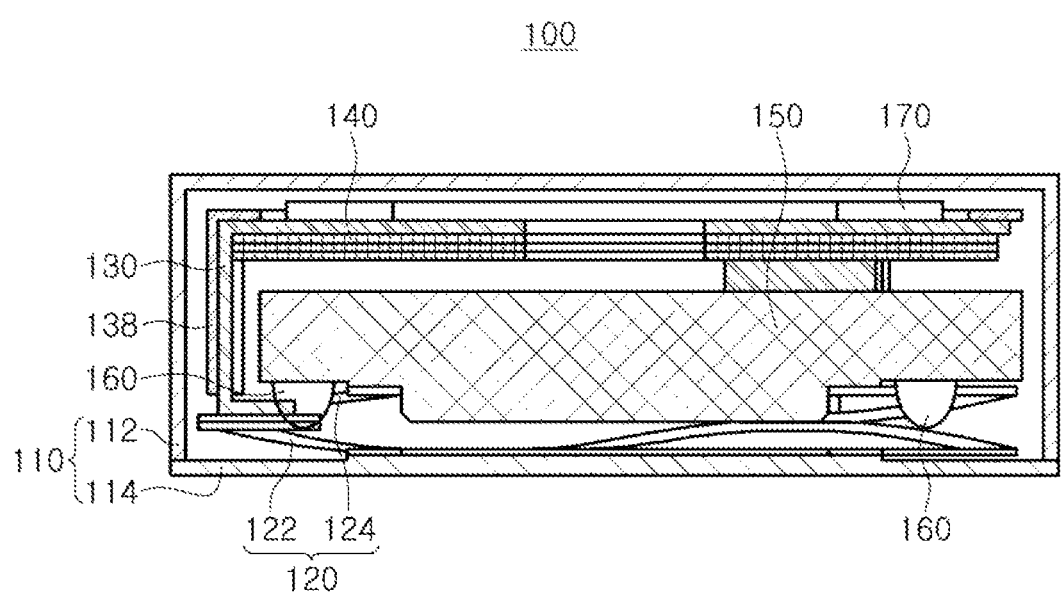
FIG. 1 is a schematic cross-sectional view of a vibration generating device according to an exemplary embodiment of the present disclosure.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
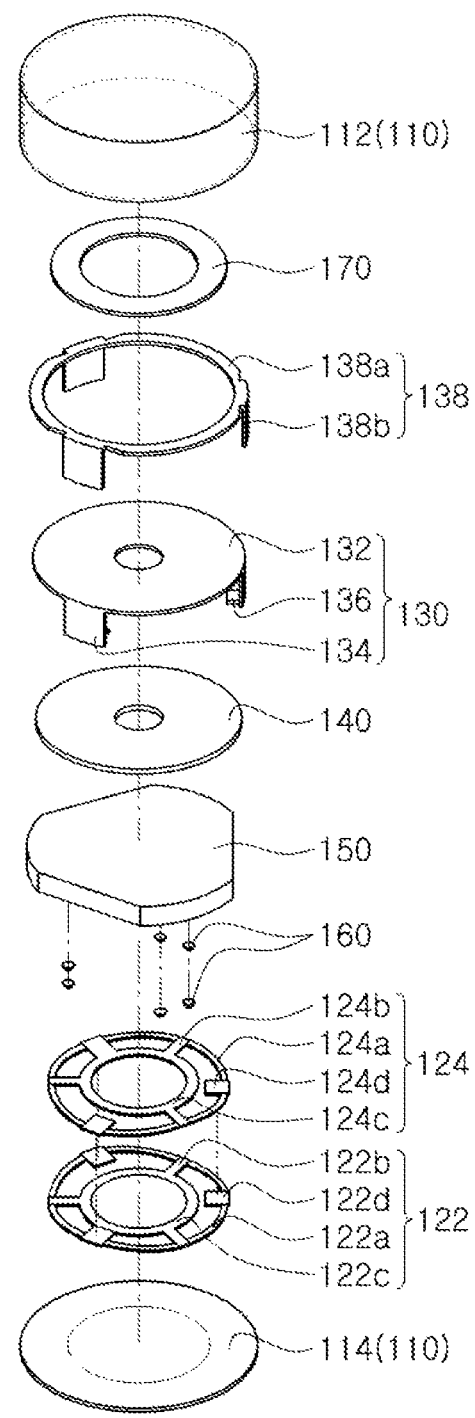
FIG. 2 is an exploded perspective view of the vibration generating device according to an exemplary embodiment of the present disclosure.

FIG. 1 is a schematic cross-sectional view of a vibration generating device according to an exemplary embodiment of the present disclosure; and FIG. 2 is an exploded perspective view of the vibration generating device according to an exemplary embodiment of the present disclosure.

Referring to FIGS. 1 and 2, a vibration generating device 100 according to an exemplary embodiment of the present disclosure may include a housing 110, elastic members 120, an installation member 130, a piezoelectric element 140, a weight 150, and a damper member 160 by way of example.

The housing 110 may have the elastic members 120 installed therein and form an appearance of the vibration generating device 100 having an internal space.

Meanwhile, the housing 110 may include a case 112 having an internal space and having a lower end portion that is open and a bracket 114 attached to the lower end portion of the case 112 to form a closed space, as shown in more detail in FIG. 2.

As an example, the case 112 may have a circular box shape of which a lower end portion is open, and the bracket 114 may have a plate shape and may be attached to the case 112.

The elastic members 120, the installation member 130, the piezoelectric element 140, the weight 150, the damper member 160, and the like, may be installed in the housing 110 having the internal space as described above.

Here, terms with respect to directions will be defined. As viewed in FIG. 1, a radial direction refers to a horizontal direction, that is, a direction from an outer peripheral surface of the housing 110 to the center thereof or a direction from the center of the housing 110 toward the outer peripheral surface thereof, and a vertical direction refers to a direction from a bottom surface of the housing 110 toward a top surface thereof or a direction from the top surface of the housing 110 toward the bottom surface thereof.

In addition, a circumferential direction refers to a rotation direction along the outer peripheral direction of the housing 110.

The elastic members 120 may be connected to the installation member 130 to change a direction of displacement due to deformation of the installation member 130, and the number of elastic members 120 may be plural. In addition, the elastic members 120 may be installed on the bracket 114 of the housing 110 and be disposed to face each other.

Figure 3:
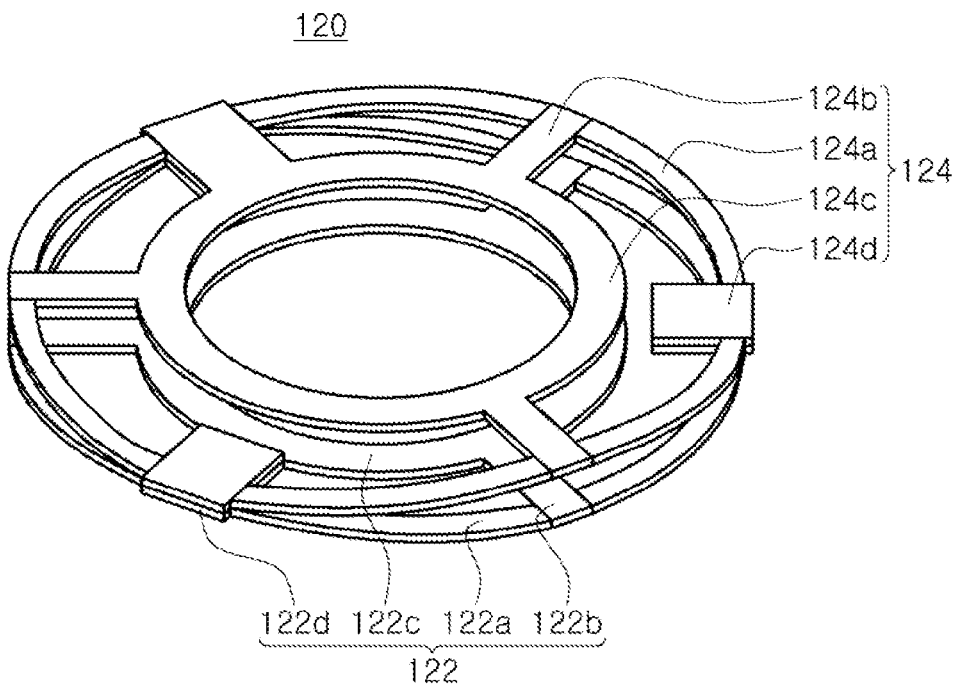
FIG. 3 is a perspective view of an elastic member of the vibration generating device according to an exemplary embodiment of the present disclosure.
Figure 4:
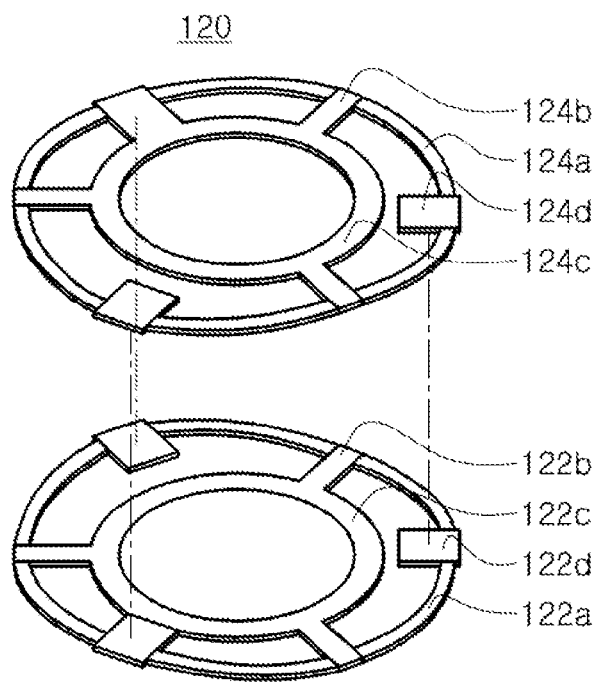
FIG. 4 is an exploded perspective view of the elastic member of the vibration generating device according to an exemplary embodiment of the present disclosure.

The elastic member 120 may include a first elastic member 122 installed on the bracket 114 and a second elastic member 124 installed on the first elastic member 122 and generating vibrations together with the first elastic member 122, as shown in more detail in FIGS. 3 and 4.

Meanwhile, the first and second elastic members 122 and 124 may have the same shape and have the same configuration except that directions of curves of outer ring portions 122a and 124a are opposite to each other. Therefore, hereinafter, only the first elastic member 122 will be described in detail, and a description for the second elastic member 124 will be replaced by a description for the first elastic member 122.

The first elastic member 122 may have the outer ring portion 122a, connection portions 122b, an inner ring portion 122c, and bonded portions 122d.

The outer ring portion 122a may have a ring shape and have curves. As an example, the outer ring portion 122a may be flatly formed to be in parallel with the bracket 114 in regions in which the bonded portions 122d are formed and be formed to have a curvature in regions in which the connection portions 122b are formed.

Meanwhile, the outer ring portion 122a may be bonded to the bracket 114. In detail, the regions of the outer ring portion 122a in which the connection portions 122b are formed may be fixedly installed on the bracket 114.

A plurality of connection portions 122b may be extended from the outer ring portion 122a in an inner diameter direction. In addition, the connection portions 122b may be disposed to be spaced apart from each other by an angle of 120 degrees by way of example. That is, three connection portions 122b may be extended from the outer ring portion 122a.

The inner ring portion 122c may be connected to the connection portions 122b and have a ring shape. Meanwhile, the inner ring portion 122c may have a diameter smaller than that of the outer ring portion 122a and be flatly formed. In other words, the inner ring portion 122c may have a ring shape that does not have curves.

That is, the inner ring portion 122c may be connected to the outer ring portion 122a through the connection portions 122b.

The bonded portions 122d may be extended from the outer ring portion 122a in the inner diameter direction to be disposed between the connection portions 122b. As an example, the boned parts 122d may be disposed to be spaced apart from each other by an angle of 120 degrees, similar to the connection portions 122b. That is, three bonded portions 122d may be extended from the outer ring portion 122a.

Meanwhile, the second elastic member 124 may include an outer ring portion 124a, connection portions 124b, an inner ring portion 124c, and bonded portions 124d, similar to the first elastic member 122.

Here, a method of assembling the first and second elastic members 122 and 124 to each other will be described. The first and second elastic members 122 and 124 may have the bonded portions 122d and 124d bonded to each other, and may be disposed to be maximally spaced apart from each other in regions in which the connection portions 122b and 124 of the outer ring portions 122a and 124a are formed. That is, the outer ring portions 122a and 124a of the first and second elastic members 122 and 124 may have a ring shape having curves. In addition, portions having the curves in the outer ring portions 122a and 124a may be disposed to be spaced apart from each other, and portions flatly formed in the outer ring portions 122a and 124a may contact each other.

Meanwhile, the first and second elastic members 122 and 124 attached to each other as described above may vibrate while contacting each other or being maximally spaced apart from each other in the regions in which the connection portions 122b and 124 of the outer ring portions 122a and 124a are formed at the time of generation of vibrations.

A detailed description thereof will be provided below.

The piezoelectric element 140 may be installed below the installation member 130. In addition, the installation member 130 may be connected to the elastic member 120 and serve to change a displacement direction together with the elastic member 120.

To this end, the installation member 130 may include a plate portion 132, displacement direction changing portions 134, and fixed portions 136.

The plate portion 132 may have a circular plate shape and have a diameter larger than that of the piezoelectric element 140. In addition, the plate portion 132 may have a hole formed in the center thereof in order to allow air to flow at the time of the generation of the vibrations.

In addition, a plurality of displacement direction changing portions 134 may be extended downwardly from an edge of the plate portion 132 and be disposed to be spaced apart from each other in the circumferential direction. As an example, the displacement direction changing portions 134 may be disposed to be spaced apart from each other in the circumferential direction by an angle of 120 degrees.

In addition, the fixed portions 136 may be extended from the displacement direction changing portions 134 in the inner diameter direction and be bonded to the elastic member 120. As an example, the fixed portions 136 may be bonded to the bonded portions 124d of the second elastic member 124.

Meanwhile, an operation of the installation member 130 will be briefly described. A lower end portion of the displacement direction changing portion 134 of the installation member 130 may move in the radial direction by deformation of the piezoelectric element 140. That is, when the piezoelectric element 140 is deformed so that a central portion thereof has a concave shape, the lower end portion of the displacement direction changing portion 134 of the installation member 130 may move in an outer diameter direction. In addition, when the piezoelectric element 140 is deformed so that the central portion thereof has a convex shape, the displacement direction changing portion 134 of the installation member 130 may move in the inner diameter direction.

Therefore, the bonded portions 124d of the second elastic member 124 to which the fixed portions 136 are bonded and the bonded portions 122d of the first elastic member 124 bonded to the bonded portions 124d may vertically move.

Meanwhile, a frequency adjusting member 138 may be installed on the installation member 130. The frequency adjusting member 138 may include a ring shaped body 138a having a ring shape and bonded to an upper surface of the plate portion 132 and a reinforcing portion 138b extended from the ring shaped body 138a to correspond to the displacement direction changing portion 134.

Although the case in which the frequency adjusting member 138 is installed on the installation member 130 has been described by way of example in the present exemplary embodiment, the present disclosure is not limited thereto. That is, the frequency adjusting member 138 may not be formed on the installation member 130. In this case, the installation member 130 may be formed at a thicker thickness.

The piezoelectric element 140 may be fixedly installed below the installation member 130. As an example, the piezoelectric element 140 may be fixedly installed on a lower surface of the plate portion 132. Meanwhile, the piezoelectric element 140 may have a circular plate shape and have a diameter smaller than that of the plate portion 132. In addition, the piezoelectric element 140 may also have a hole formed in the center thereof in order to allow air to smoothly flow at the time of being deformed.

In addition, in the case in which power is applied to the piezoelectric element 140, the piezoelectric element 140 may be deformed so that a central portion thereof is concave or convex.

Meanwhile, although not shown, a board may be connected to the piezoelectric element 140 so that the power may be applied to the piezoelectric element 140.

The weight 150 may be installed on the elastic member 120 and serve to amplify the vibrations generated by the deformation of the piezoelectric element 140. Meanwhile, the weight 150 may be seated on and bonded to an upper surface of the second elastic member 124 by way of example.

In addition, the weight 150 may have a step and have a lower end portion inserted into the inner ring portion 124c. Meanwhile, the weight 150 may be formed of a material having a high specific gravity in order to amplify the vibrations, for example, tungsten or iron.

In other words, in order to increase a vibration amount by adjusting a resonance frequency through an increase in a mass in the same volume, the weight 150 may be formed of the material having the high specific gravity.

The damper member 160 may be fixedly installed on a lower surface of the weight 150. Meanwhile, the damper member 160 may be disposed in spaces formed by the plurality of elastic members 120 when the elastic members 120 are driven normally. That is, a thickness of the damper member 160 may be determined to allow the damper member 160 to contact the bracket 114 by protruding from the elastic members 120 in the case in which the weight 150 abnormally vibrates due to external impacts, or the like.

In other words, the thickness of the damper member 160 may be determined to allow the damper member 160 to not contact the bracket 114 when the vibration generating device is driven normally and to contact the bracket 114 when the vibration generating device is abnormally driven.

Therefore, a contact between a component such as the weight 150 and the housing 110 due to the external impact may be prevented without limiting driving displacement of the component such as the weight 150, which is a vibrator, or the like, thereby preventing damage.

Meanwhile, the damper member 160 includes a plurality of damper members 160 that may be disposed to be spaced apart from each other in the circumferential direction. As an example, the damper members 160 may be installed below the weight 150 to be disposed between the outer ring portions 122a and 124a and the inner ring portions 122c and 124c and may be disposed to be spaced apart from each other in order not to interfere with the connection portions 122b and 124b.

In addition, for example, six damper members 160 may be installed below the weight 150. Further, the damper members 160 may have a hemispherical shape or a polyprismatic shape. Meanwhile, in the case in which the damper members 160 are formed in the hemispherical shape, even though the damper members 160 contact the bracket 114 when the vibration generating device is driven normally, the limitation of the displacement may be further suppressed.

Meanwhile, the vibration generating device 100 according to an exemplary embodiment of the present disclosure may further include a contact preventing member 170 installed on at least one of the housing 110 and the installation member 130 and preventing generation of noise or damage due to collision by way of example.

As described above, since the damper member 160 has the thickness at which it contacts the bracket 114 only when the vibration generating device is driven normally, an impact amount due to the external impact may be alleviated, and a decrease in a vibration amount when the vibration generating device is driven normally may be suppressed.

Figure 5:
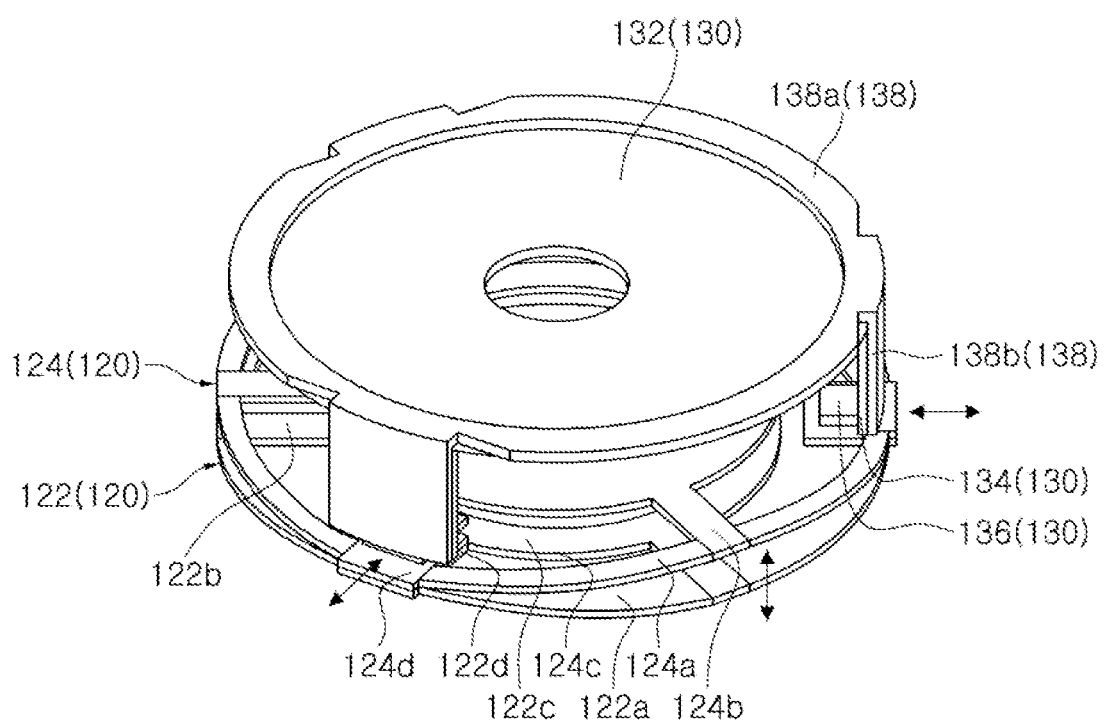
FIG. 5 is a view illustrating an operation of the vibration generating device by an installation member and the elastic member according to an exemplary embodiment of the present disclosure.
Figure 6:
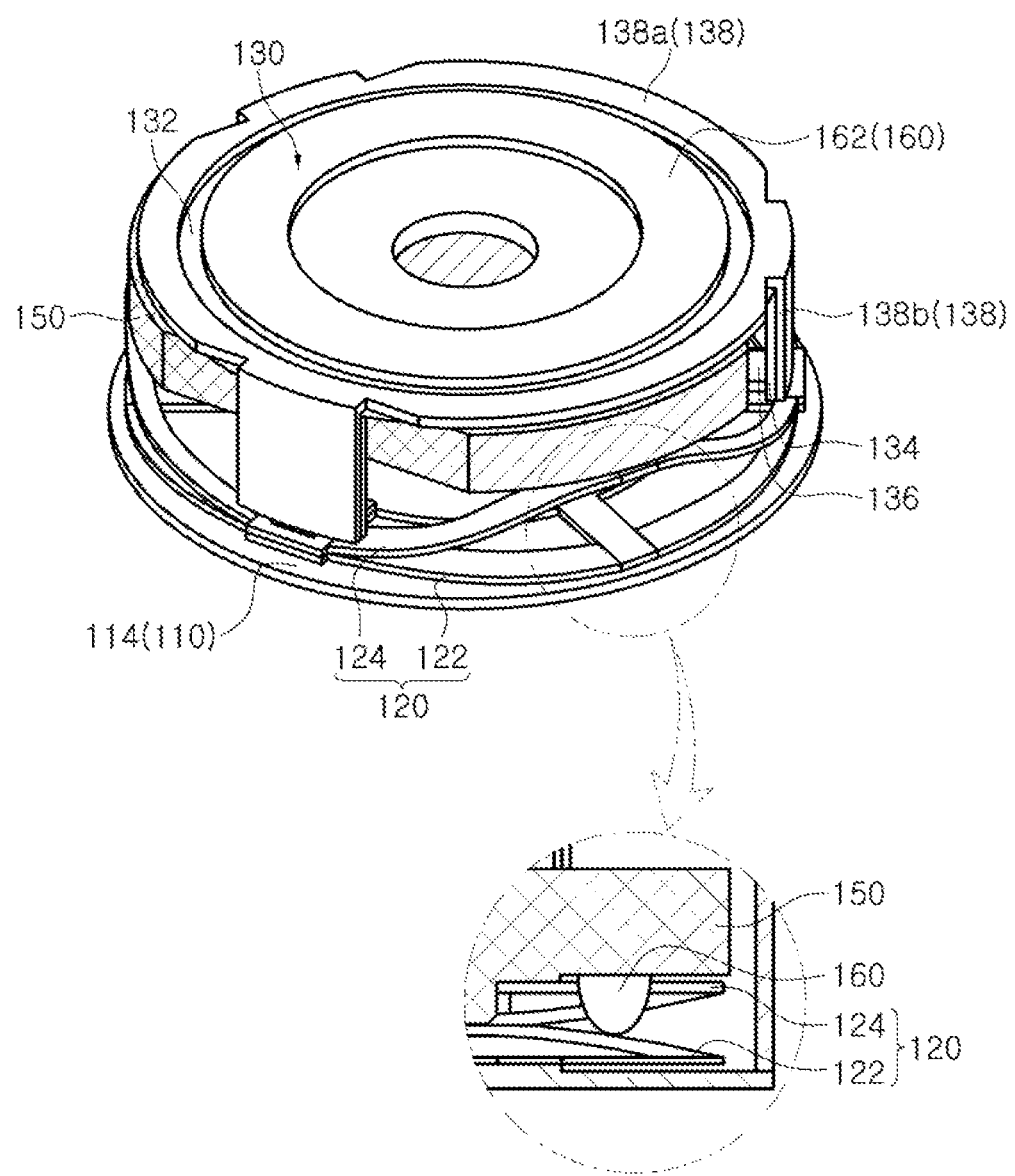
FIGS. 6 and 7 are views illustrating an operation of the vibration generating device according to an exemplary embodiment of the present disclosure.
Figure 7:
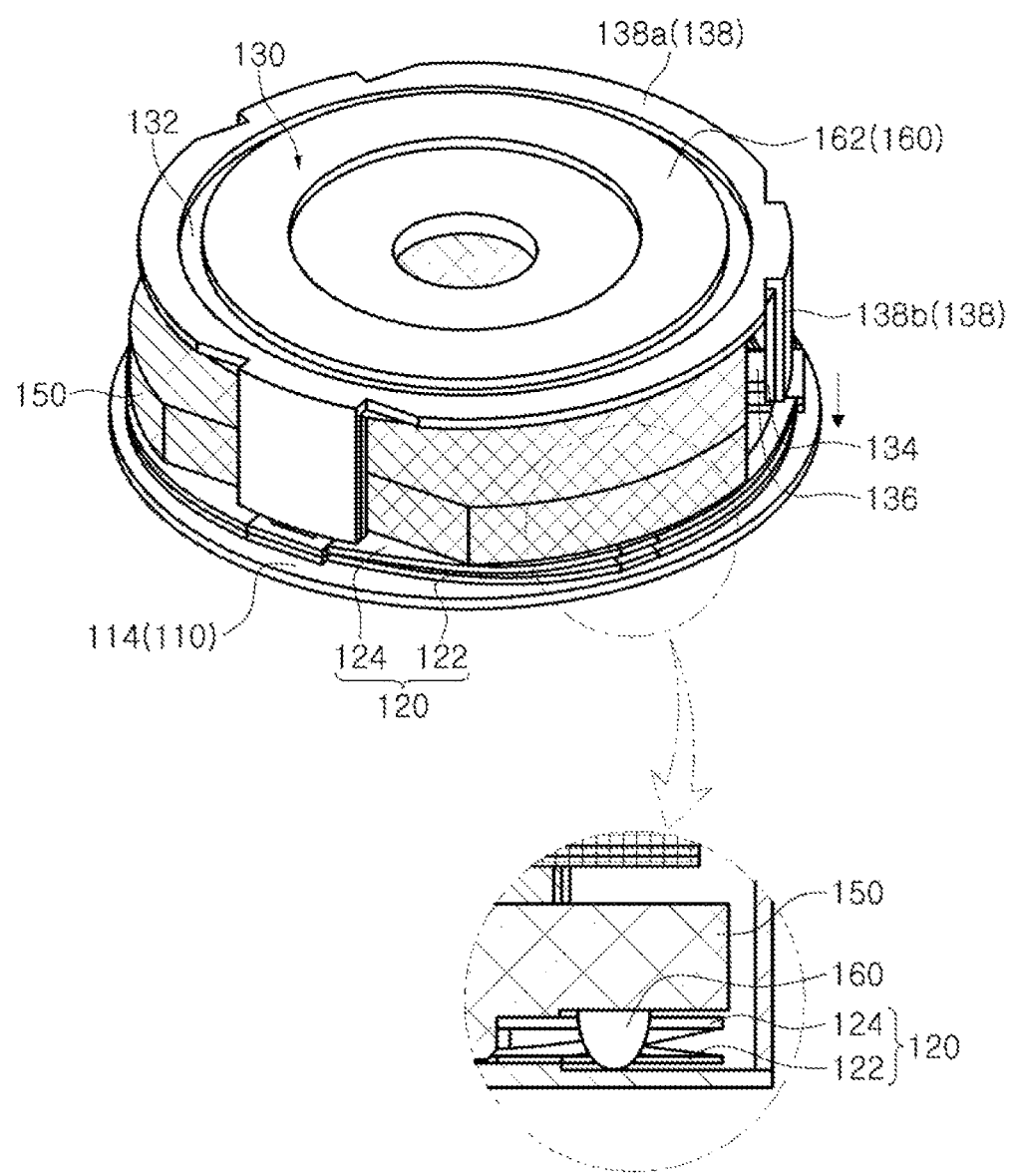

FIG. 5 is a view illustrating an operation of the vibration generating device by an installation member and the elastic member according to an exemplary embodiment of the present disclosure; and FIGS. 6 and 7 are views illustrating an operation of the vibration generating device according to an exemplary embodiment of the present disclosure.

Referring to FIGS. 5 through 7, in the case in which power is applied to the piezoelectric element 140, the piezoelectric element 140 may be deformed so that a central portion thereof is concave or convex. In other words, when the power is applied to the piezoelectric element 140, an edge of the piezoelectric element 140 may be relatively upwardly deformed and be then downwardly deformed repeatedly with respect to the central portion thereof. That is, the edge of the piezoelectric element 140 may relatively upwardly and downwardly move based on the central portion thereof.

Therefore, the installation member 130 below which the piezoelectric element 140 is fixedly installed may also be deformed like the piezoelectric element 140. That is, the plate portion 132 of the installation member 130 may be deformed like the piezoelectric element 140.

As described above, the lower end portion of the displacement direction changing portion 134 may be repeatedly deformed in the inner diameter direction and the outer diameter direction by the deformation of the plate portion 132 of the installation member 130.

Therefore, vibrations may be generated so that central portions of the elastic member 120 are disposed adjacently to each other and are then spaced apart from each other.

In other words, portions in which extended parts of the outer ring portions 122a and 124a that are not bonded to each other are formed may vertically vibrate, and portions in which the bonded portions 122d and 124d of the outer ring portions 122a and 124a are formed may be maintained in a fixed state.

Meanwhile, in the case in which the vibrations are generated as described above, the damper member 160 may not contact the bracket 114 positioned therebelow, as shown in FIGS. 6 and 7. That is, since the damper member 160 has a thickness at which it does not contact the bracket 114 when the vibration generating device is driven normally, it may not contact the bracket 114. Therefore, a decrease in a vibration amount due to the damper member 160 may be suppressed.

However, the damper member 160 may contact the bracket 114 when the vibration generating device is abnormally driven due to external impact.

Therefore, damage to the vibrator such as the weight 150, or the like, due to the external impact may be prevented.

As described above, an impact amount due to the external impact may be alleviated, and a decrease in a vibration amount may be suppressed.

Figure 8:
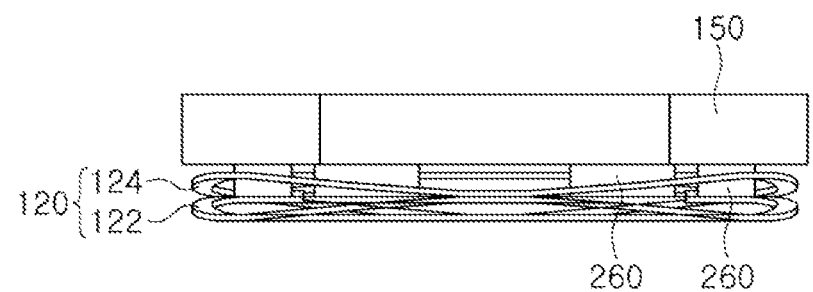
FIGS. 8 and 9 are views of modified examples of a damper member.
Figure 9:
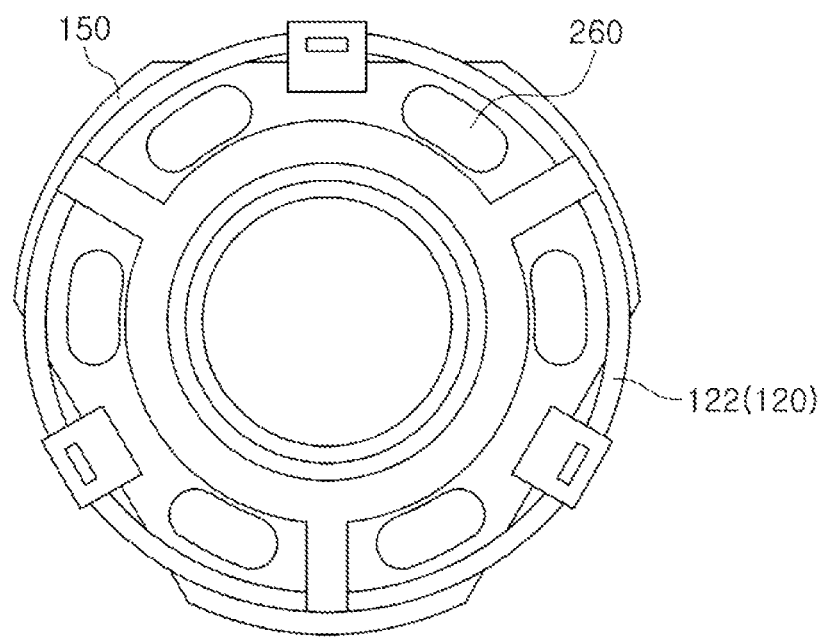

Meanwhile, FIGS. 8 and 9 are views of modified examples of damper members.

Referring to FIGS. 8 and 9, damper members 260 may be fixedly installed on the lower surface of the weight 150. Meanwhile, the damper members 260 may be disposed in spaces formed by the plurality of elastic members 120 when the elastic members 120 are driven normally. That is, the damper members 260 may have a thickness enough to contact the bracket 114 (See FIG. 1) by protruding from the elastic member 120 in the case in which the weight 150 abnormally vibrates due to external impact, or the like.

In other words, the damper members 260 may have a thickness at which they do not contact the bracket 114 when the vibration generating device is driven normally and contact the bracket 114 when the electric element is abnormally driven.

Therefore, a contact between a component such as the weight 150, or the like, and the housing 110 (See FIG. 1) at the time of the external impact may be prevented without limiting driving displacement of the component such as the weight 150, which is a vibrator, or the like, thereby preventing damage.

Meanwhile, a plurality of damper members 260 may be disposed to be spaced apart from each other in the circumferential direction. As an example, the damper members 260 may be installed below the weight 150 to be disposed between the outer ring portions 122a and 124a and the inner ring portions 122c and 124c and may be disposed to be spaced apart from each other in order not to interfere with the connection portions 122b and 124b.

In addition, for example, six damper members 260 may be installed below the weight 150. Further, the damper members 260 may have an elliptical pillar shape.

As set forth above, according to exemplary embodiments of the present disclosure, the external impact may be alleviated and the decrease in the vibration amount may be suppressed.

While exemplary embodiments have been shown and described above, it will be apparent to those skilled in the art that modifications and variations could be made without departing from the scope of the present invention as defined by the appended claims.

What is claimed is:

1. A vibration generating device comprising:
  a piezoelectric element which is deformed when power is applied thereto;
  an installation member below which the piezoelectric element is installed;
  a weight fixedly installed below the installation member to be disposed below the piezoelectric element;
  a plurality of elastic members connected to the installation member to change a displacement direction by deformation of the installation member and disposed to face each other; and
  a damper member fixedly installed on a lower surface of the weight,
  wherein a thickness of the damper member is determined to allow the damper member to be disposed in a space formed by the plurality of elastic members when the elastic members are driven normally.

2. The vibration generating device of claim 1, wherein the damper member comprises a plurality of damper members which are disposed to be spaced apart from each other in a circumferential direction.

3. The vibration generating device of claim 1, wherein the damper member has a hemispherical shape or a polyprismatic shape.

4. The vibration generating device of claim 1, further comprising a housing having an internal space in which the elastic members are installed.

5. The vibration generating device of claim 4, wherein the housing includes:
  a case having an internal space and having a lower end portion that is open; and
  a bracket attached to the lower end portion of the case to form a closed space.

6. The vibration generating device of claim 5, wherein the elastic members include:
  a first elastic member installed on the bracket; and
  a second elastic member installed on the first elastic member and generating vibrations together with the first elastic member.

7. The vibration generating device of claim 6, wherein each of the first and second elastic members includes:
  an outer ring portion being curved and having a ring shape;
  a plurality of connection portions extended from the outer ring portion in an inner diameter direction;
  an inner ring portion connected to the plurality of connection portions and having a ring shape; and
  bonded portions extended from the outer ring portion to be disposed between the connection portions.

8. The vibration generating device of claim 7, wherein the first and second elastic members are coupled to each other in the bonded portions and are disposed to be maximally spaced apart from each other in portions thereof adjacent to the connection portions.

9. The vibration generating device of claim 7, wherein the bonded portions have an angle of 120 degrees therebetween.

10. The vibration generating device of claim 5, wherein the installation member includes:
  a plate portion having a circular shape;
  displacement direction changing portions extended downwardly from the plate portion; and
  fixed portions extended from the displacement direction changing portion in an inner diameter direction and bonded to the elastic members.

11. The vibration generating device of claim 10, further comprising a frequency adjusting member installed on the installation member,
  wherein the frequency adjusting member includes:
  a ring shaped body having a ring shape and bonded to an upper surface of the plate portion; and
  a reinforcing portion extended from the ring shaped body to correspond to the displacement direction changing portion.

12. A vibration generating device comprising:
  a housing including a case having an internal space and having a lower end portion that is open and a bracket attached to the lower end portion of the case to form a closed space;

a plurality of elastic members installed on the bracket and disposed to face each other;

an installation member connected to the elastic members and changing a displacement direction together with the elastic members;

a piezoelectric element fixedly installed on a lower surface of the installation member and deformed when power is applied thereto;

a weight installed on the elastic members to be disposed below the piezoelectric element;

a damper member fixedly installed on a lower surface of the weight, a thickness thereof being determined to allow the damper member to be disposed in a space formed by the plurality of elastic members when the elastic members are driven normally; and a frequency adjusting member fixedly installed on the installation member.

* * * * *